United States Patent
Li et al.

(10) Patent No.: US 12,189,443 B2
(45) Date of Patent: Jan. 7, 2025

(54) THERMAL REGULATION AND PROTECTION FOR POWER ELECTRONIC COMPONENTS

(71) Applicant: Infineon Technologies AG, Neubiberg (DE)

(72) Inventors: Zhe Li, Gimpo (KR); Rafael Antonio Garcia Mora, Villach (AT)

(73) Assignee: Infineon Technologies AG, Neubiberg (DE)

( * ) Notice: Subject to any disclaimer, the term of this patent is extended or adjusted under 35 U.S.C. 154(b) by 29 days.

(21) Appl. No.: 18/065,547

(22) Filed: Dec. 13, 2022

(65) Prior Publication Data

US 2023/0195189 A1 Jun. 22, 2023

(30) Foreign Application Priority Data

Dec. 21, 2021 (DE) .................. 102021134028.4

(51) Int. Cl.
*G06F 1/20* (2006.01)
*G06F 1/28* (2006.01)
(Continued)

(52) U.S. Cl.
CPC ............ *G06F 1/206* (2013.01); *G06F 1/28* (2013.01); *G06F 2200/201* (2013.01); *H02M 1/327* (2021.05); *H03K 2017/0806* (2013.01)

(58) Field of Classification Search
CPC . G06F 1/189; G06F 1/20; G06F 1/203; G06F 1/206; G06F 1/26; G06F 1/266; G06F 1/28; G06F 1/30; G06F 1/305; G06F 1/3296; G06F 2200/201; H02M 1/327; H03K 2017/0806; H05K 7/20281; H05K 7/20381

See application file for complete search history.

(56) References Cited

U.S. PATENT DOCUMENTS

2009/0072770 A1* 3/2009 Son ..................... H02P 29/68
180/65.8
2009/0303761 A1* 12/2009 Radbrant ................. H02J 3/36
363/51

(Continued)

FOREIGN PATENT DOCUMENTS

CN 109823193 A 5/2019
DE 102007046087 A1 4/2009
(Continued)

*Primary Examiner* — Thomas J. Cleary
(74) *Attorney, Agent, or Firm* — Shumaker & Sieffert, P.A.

(57) ABSTRACT

A cooling system is thermally coupled to a power electronic system and configured to carry heat away from the power electronic system using a cooling agent. A system controller is configured to receive information concerning a sensed temperature of a semiconductor switch and a temperature of the cooling agent (coolant). The system controller is further configured to adjust a power of the power electronic system by controlling the switching operation of the semiconductor switch. When the temperature of the coolant is below a threshold temperature, then the controller adjusts the power of the power electronic system to a target value greater than the rated maximum power based on the sensed temperature of the semiconductor switch and the temperature of the cooling agent.

13 Claims, 4 Drawing Sheets

(51) Int. Cl.
*H02M 1/32* (2007.01)
*H03K 17/08* (2006.01)

(56) References Cited

U.S. PATENT DOCUMENTS

| | | | |
|---|---|---|---|
| 2009/0315665 A1* | 12/2009 | Hoult | G06F 1/206 |
| | | | 337/298 |
| 2010/0302731 A1* | 12/2010 | Belikoff | H05K 7/20945 |
| | | | 361/722 |
| 2014/0180493 A1 | 6/2014 | Csonti et al. | |
| 2014/0240031 A1* | 8/2014 | Vadakkanmaruveedu | ............... |
| | | | G06F 1/206 |
| | | | 327/512 |
| 2015/0094870 A1* | 4/2015 | Fornage | G05B 13/026 |
| | | | 700/291 |
| 2016/0373047 A1* | 12/2016 | Loken | H02M 7/53875 |
| 2017/0033722 A1* | 2/2017 | Ochs | H02P 27/085 |
| 2017/0168531 A1* | 6/2017 | Casparian | G06F 1/206 |
| 2017/0244390 A1* | 8/2017 | Yamahira | H03K 17/04 |
| 2018/0172522 A1 | 6/2018 | Lee et al. | |
| 2020/0094685 A1* | 3/2020 | Chen | B60L 50/60 |
| 2023/0182756 A1* | 6/2023 | Ademane | B60W 50/087 |
| | | | 701/36 |

FOREIGN PATENT DOCUMENTS

| | | |
|---|---|---|
| DE | 102013226854 B4 | 6/2017 |
| WO | 2007084037 A1 | 7/2007 |

\* cited by examiner

THERMAL REGULATION AND PROTECTION FOR POWER ELECTRONIC COMPONENTS

This Application claims priority to German Application Number 102021134028.4, filed on Dec. 21, 2021, the entire content of which is incorporated herein by reference.

TECHNICAL FIELD

The present disclosure relates to the field of power electronics, in particular to the thermal management in power electronic systems.

BACKGROUND

In many applications, such as, for example, in electrical vehicles (EVs), power electronic systems are operated in a wide range of ambient temperatures (e.g. from −40° C. up to 80° C.). Many power electronic systems need to be actively cooled. For this purpose, the power electronic components of the system are thermally connected to a cooling circuit, in which water or any other cooling agent (coolant) may recirculate to transport heat away from the power electronic system. In practical applications, the temperature of the coolant may also vary within a relatively wide range, e.g. from −40° C. to 70° C.

In power electronic systems such as AC/DC or DC/DC converters, OBCs (on-board chargers) for EVs, or the like, a significant portion of the dissipated heat is generated in power semiconductor switches. A critical parameter of such semiconductor devices is the maximum junction temperature $T_{J,max}$. A junction temperatures higher than the specified maximum temperature $T_{J,max}$ may quickly destroy the respective power electronic component.

In order to avoid damage, the power electronic system is usually designed such that the maximum junction temperature is not exceed even during operation at the highest specified coolant temperature and at the maximum specified power throughput (full load). However, in practice it is often the case that maximum power is needed at low temperature. A typical scenario is an electric vehicle which needs additional power for heating the battery and the passenger cabin at very low ambient temperatures. The "classical" design approach, according to which a power electronic system is designed for maximum power at maximum coolant/ambient temperature and the maximum power is basically constant for the whole operating temperature range, leads to a cost-inefficient overdesign of power electronic systems which need the maximum output mainly at low temperatures. Most of the thermal headroom and potential performance is unused at lower temperatures.

In view of the above, the inventors have identified a need for improvement and set themselves the task to provide a power electronic system with an improved thermal management concept.

SUMMARY

The mentioned objective is achieved by the system of claim 1 as well as the method of claim 8. Various embodiments and further developments are covered by the dependent claims.

One embodiment relates to a system that includes a power electronic system and a cooling system. The power electronic system includes a semiconductor switch, which has a rated maximum temperature. The power electronic system itself has a rated maximum power. The system further includes a temperature sensor that is configured to sense a temperature of the (at least one) semiconductor switch. The cooling system is thermally coupled to the power electronic system and configured to carry heat away from the power electronic system using a cooling agent. A system controller is configured to receive information concerning the sensed temperature of the semiconductor switch and a temperature of the cooling agent (coolant). The system controller is further configured to adjust a power of the power electronic system by controlling the switching operation of the semiconductor switch. When the temperature of the coolant is below a threshold temperature, then the controller adjusts the power of the power electronic system to a target value greater than the rated maximum power based on the sensed temperature of the semiconductor switch and the temperature of the cooling agent.

Another embodiment relates to a method for controlling a power electronic system. Accordingly, the method includes sensing a temperature of a semiconductor switch included in the power electronic system, and adjusting a power of the power electronic system by controlling the switching operation of the semiconductor switch. Thereby, when the temperature of a cooling agent, which is used to cool the power electronic system, is below a threshold temperature, the power of the power electronic system is adjusted to a target value greater than the rated maximum power based on the sensed temperature of the semiconductor switch and the temperature of the cooling agent.

BRIEF DESCRIPTION OF THE DRAWINGS

The embodiments described below can be better understood with reference to the following drawings and descriptions. The components in the figures are not necessarily to scale; instead emphasis is placed upon illustrating the principles underlying the embodiments. Moreover, in the figures, like reference numerals designate corresponding parts. In the drawings.

DETAILED DESCRIPTION

According to known design approaches, power electronic (PE) components and systems have the same maximum power (also referred to as "rated power") throughout the whole operating temperature range (e.g. −40° C. to 80° C.) regardless of the actual operating temperature and the actual power at different operating temperatures. A known safety concept is so-called "power derating" at high operating temperatures. That is, when the ambient temperature (e.g. measured on a circuit board or a at a housing wall of a power electronic component) exceeds a specified limit, the power of the PE component or system is gradually reduced (derated) to avoid the junction temperature $T_J$ of the PE component exceeding the maximum value $T_{J,max}$. As a consequence, PE systems, which are designed in accordance with the "traditional" approach, cannot exhaust their full potential at low operating temperatures.

As currently known thermal regulation and protection concepts are implemented by sensing the housing temperature or circuit board temperature close to the switching device, the sensed temperature may not only have a high deviation from the actual junction $T_J$ but may also have a time delay, which also requires an extra safety margin in the system design. Accordingly, the known current thermal regulation and protection concepts lead to an overdesign of the system.

Figure 1:
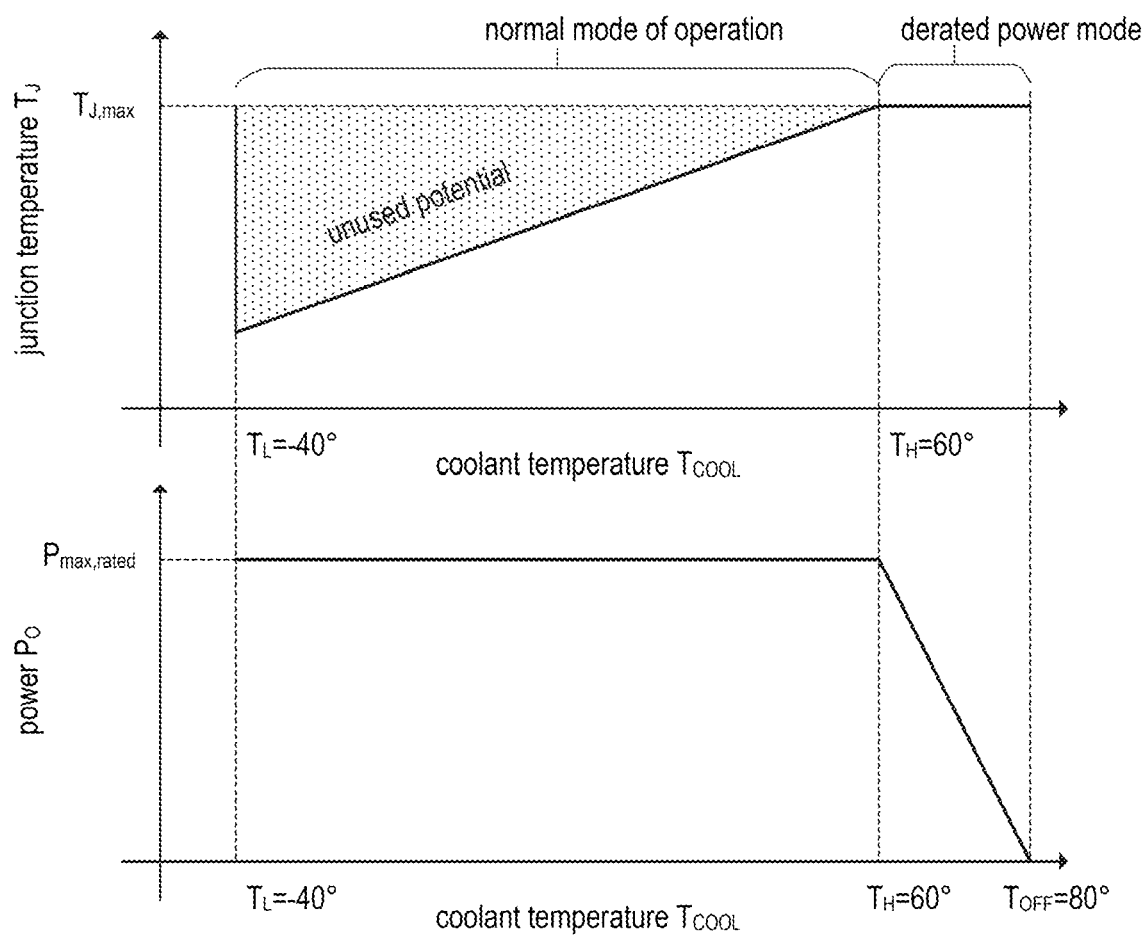
FIG. 1 illustrates a conventional control scheme for power electronic systems, in which the maximum rated power is constant throughout most of the temperature range.

The problem discussed above is further illustrated by the diagram of FIG. 1. The top diagram of FIG. 1 illustrates a power electronic device's junction temperature $T_J$ in dependency of the temperature $T_{COOL}$ of the coolant (e.g. water), which is used to cool the power electronic device. The top diagram of FIG. 1 illustrates a power electronic device's rated power (nominal power) in dependency of the coolant temperature $T_{COOL}$. For the further discussion of FIG. 1, it is assumed that each point on the curves shown in the diagrams of FIG. 1 reflects a thermally quasi-stationary state of the power electronic system, in which the temperatures do not dynamically change.

It can be seen from FIG. 1 (bottom diagram) that the system power $P_O$ corresponds to the maximum rated power $P_{max,rated}$ throughout the whole temperature range below a critical coolant temperature denoted as $T_H$ (i.e. $P_O = P_{max,rated}$ for $T_{COOL} \leq T_H$). Above the critical coolant temperature (i.e. when $T_{COOL} > T_H$), the power of the power electronic system is reduced (derated) for increasing coolant temperatures $T_{COOL}$ and dependent on the actually measured junction temperature $T_J$. In the example of FIG. 1, the power derating may be controlled by a system controller of the power electronic system based on measured values of the coolant temperature $T_{COOL}$ and the junction temperature $T_J$.

Furthermore, it can be seen from FIG. 1 (top diagram) that the junction temperature $T_J$ of the power electronic device is comparably low for low coolant temperatures and increases with increasing coolant temperatures $T_{COOL}$ until the junction temperature $T_J$ reaches its maximum value $T_{J,max}$ when the coolant temperature $T_{COOL}$ reaches the critical value $T_H$. The mentioned power derating prevents the junction temperature $T_J$ from rising beyond the maximum value $T_{J,max}$. At a certain maximum temperature $T_{OFF}$ of the coolant (i.e. when $T_{COOL} = T_{OFF}$) the system is shut down/deactivated to avoid thermal damage.

In the light of the above discussion it can be concluded that the power electronic system remains well below its potential for lower coolant temperatures, in particular for coolant temperatures below, e.g., 0° C. However, with the concept and the thermal regulation approach illustrated in FIG. 1, the system is significantly overdesigned for most of the temperature range.

Figure 2:
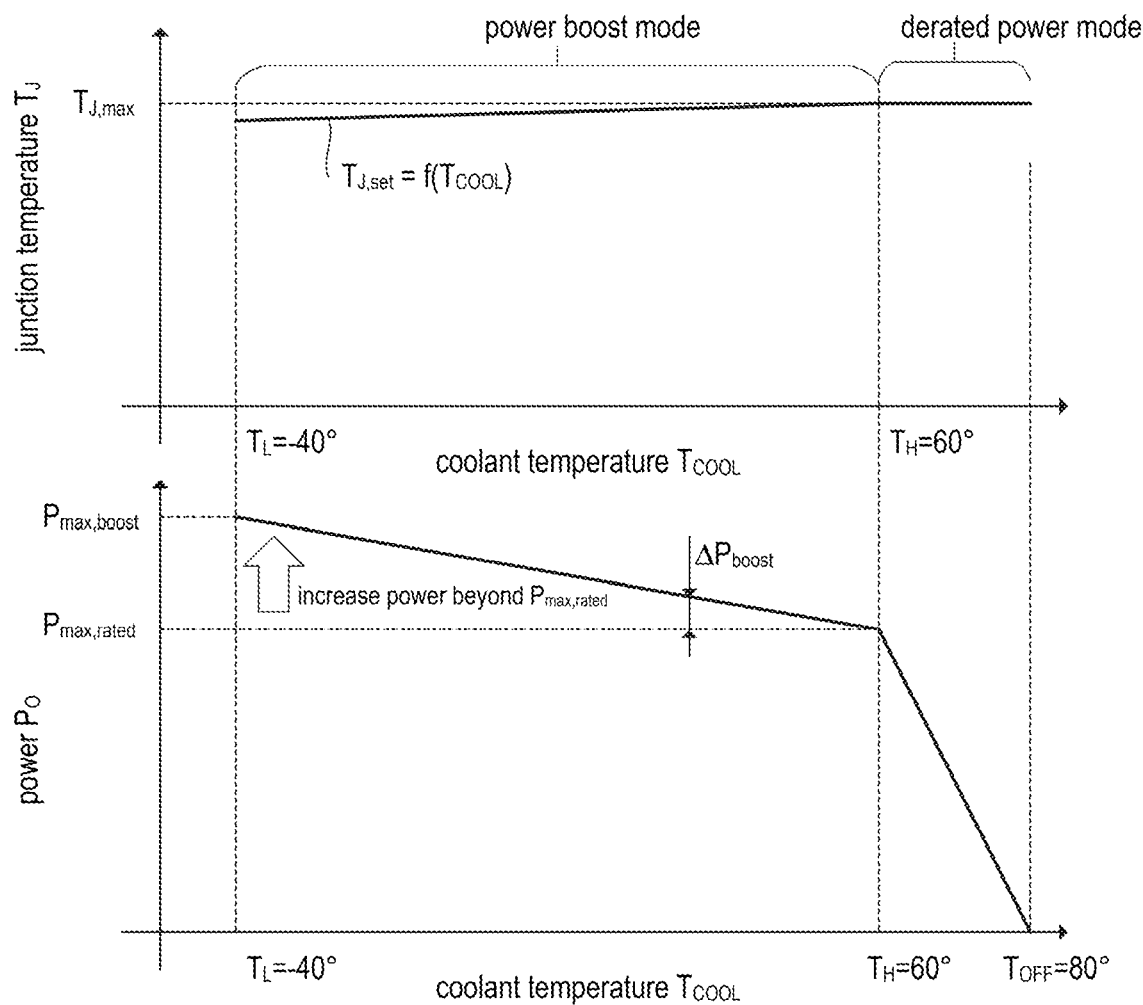
FIG. 2 illustrates one example of a novel control scheme for power electronic systems, according to which a "boost mode" is introduced for low coolant temperatures.

The diagrams of FIG. 2 illustrate a different approach. According to the example shown in the bottom diagram of FIG. 2, the power electronic system can be operated in a "boost mode", in which the power electronic devices included in the system are operated at a power $P_{max,rated} + \Delta P_{boost}$ above the maximum rated power $P_{max,rated}$ for low coolant temperatures $T_{COOL}$. The power can be increased beyond the maximum rated power $P_{max,rated}$ to such an extent that the actual junction temperature $T_J$ is close to the maximum junction temperature $T_{J,max}$. In FIG. 2, the maximum power that can be reached at the lowest coolant temperature of −40° C. is denoted as $P_{max,boost}$. The "extra power" which is available in boost mode is denoted as $\Delta P_{boost}$ which represents the additional power above the rated power $P_{max,rated}$.

The available extra power $\Delta P_{boost}$ decreases for increasing coolant temperature $T_{COOL}$ as long as the temperature $T_{COOL}$ is below the critical temperature $T_H$. The available extra power $\Delta P_{boost}$ becomes zero at the critical coolant temperature $T_H$. Above the critical coolant temperature $T_H$, the power of the power electronic system is reduced (derated) for further increasing coolant temperatures $T_{COOL}$, wherein the power derating depends on the actually measured junction temperature $T_J$ in the same way as described above with reference to FIG. 1. As mentioned, in the embodiments described herein, such a power derating may be controlled by the system controller of the power electronic system based on measured values of the coolant temperature $T_{COOL}$, the junction temperature $T_J$, and predetermined system parameters as will be discussed in more detail later (see also FIG. 5). The power electronic system is said to operate in "power derating mode" when the coolant temperature $T_{COOL}$ is above the critical temperature $T_H$ and the rated power needs to be reduced in order to prevent the actual junction temperature $T_J$ to exceed its maximum value $T_{J,max}$.

In the top diagram the temperature $T_{J,set}$ may be regarded as a threshold temperature, which may be a function of the measured coolant temperature $T_{COOL}$. For example, if the actually measured junction temperature $T_J$ does not exceed $T_{J,set}$ (i.e. if $T_J \leq T_{J,set}$ for a specific value $T_{COOL}$), the system power $P_O$ may be set to $P_{max,rated} + \Delta P_{boost}$, wherein the value of $\Delta P_{boost}$ may also depend on the measured coolant temperature $T_{COOL}$. When the actually measured junction temperature $T_J$ exceeds $T_{J,set}$ (i.e. if $T_J > T_{J,set}$ for a specific value $T_{COOL}$), the system power $P_O$ may be set to $P_{max,rated}$ ($\Delta P_{boost} = 0$) in order to prevent thermal damage or thermally critical system states.

Figure 3:
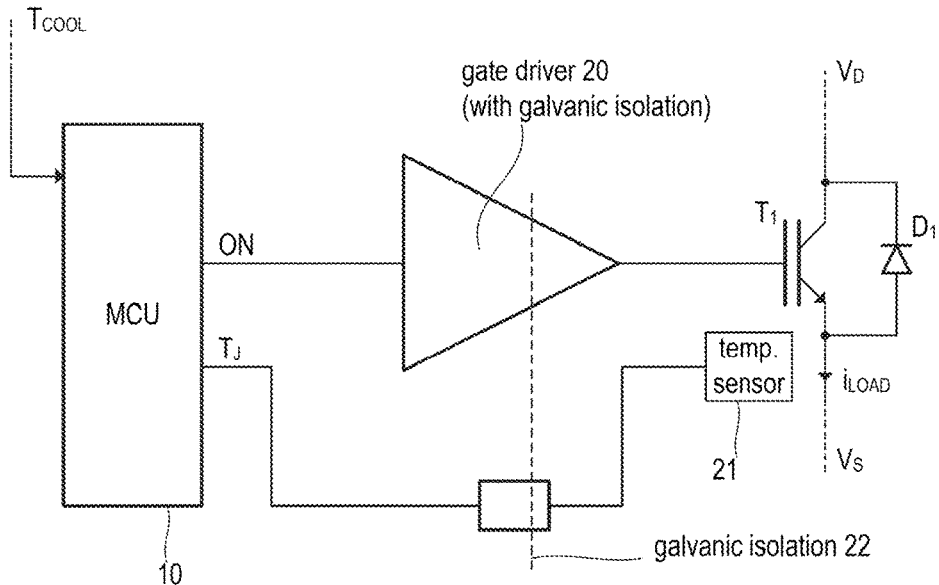
FIG. 3 is a simplified example of a power electronic system.

FIG. 3 illustrates one example of a simple power electronic system. Accordingly, the system includes at least one power electronic device $T_1$, which is an electronic switch implemented by an insulated gate bipolar transistor (IGBT) in the present example. It is understood that the IGBT is merely an example and other devices may be used instead such as metal-oxide-semiconductor (MOS) field effect transistors (FETs), bipolar junction transistors (BJTs), high electron mobility transistors (HEMTs), diodes, thyristors or the like. The system further includes a controller 10, which may be a logic circuit (programmable or hard-wired), a microcontroller, a digital signal processor (DSP), any other circuitry including a programmable arithmetic-logic unit (ALU), which can execute firmware/software to provide the desired function, or any combination of the aforementioned. Of course the controller can be composed of both, hard-wired or (one-time) programmable logic circuitry and a processor for executing software instructions). The controller 10 receives information concerning the junction temperature $T_J$ of the electronic switch $T_1$ as well as information concerning the temperature $T_{COOL}$ of a coolant circulating in a cooling system (the coolant system is not explicitly shown in FIG. 1 to keep the illustration simple).

It is understood that FIG. 3 has to be regarded as a simplified example and that the IGBT is a placeholder for any suitable power electronic device and, generally, the circuit (IGBT, temperature sensor, gate, driver, etc.) of FIG. 3 is a placeholder for a more complex power electronic system such as an multi-phase inverter, a switched mode power supply (SMPS), an AC/DC converter or a DC/DC converter, an on-board charger for batteries of electric or plug-in hybrid electric vehicles, etc.

The junction temperature $T_J$ may be measured in any conventional manner. For example, a temperature sensor 21 may be used to obtain information representing the junction temperature $T_J$. The temperature sensor 21 may be integrated in the electronic switch $T_1$ or mounted on a housing of the electronic switch $T_1$ or mounted on a circuit board in close vicinity to the electronic switch $T_1$. Regardless of the actual system design, the temperature sensor 21 needs to be thermally coupled to the power electronic device so that the measured temperature represents the actual junction temperature $T_J$ sufficiently well. It is understood that in practice there will always be a small deviation between the measured temperature and the actual junction temperature $T_J$ present in the interior of the power electronic device. Nevertheless, the measured temperature may be taken as an indication of the junction temperature $T_J$.

A further sensor, which thermally coupled to the coolant recirculating in the cooling system, can be used to obtain the coolant temperature $T_{COOL}$. The measured values representing the coolant temperatures may be transmitted to the controller 10 via a digital communication link (e.g. a serial bus such as an SPI bus, a CAN bus or the like). Alternatively, an analog sensor signal may be received any digitized by the controller 10 or the further sensor may be directly connected to the controller 10.

The controller 10 is configured to trigger a switch-on and a switch-off of the power electronic device(s) such as the electronic switch $T_1$. In the present example, in which the electronic switch $T_1$ is implemented using an IGBT, a gate driver circuit 20 (short gate driver) may be used. The gate driver 20 receives a logic signal ON generated by the controller 10 and generates a corresponding gate signal (gate voltage or gate current) for the IGBT $T_1$. A transition of the logic signal to a high level (ON=1) may indicate a switch-on, whereas a transition to a low level (ON=0) may indicate a switch-off of the IGBT $T_1$. In the present example, the gate driver 20 includes a galvanic isolation between its input and its output. Additionally, a galvanically isolating device 22 is arranged in the signal path between the temperature sensor 22 and the controller 10 to fully isolate the controller 10 (and peripheral circuitry) from the power electronics. It is understood that the controller 10 may driver the power electronic device(s) such as the IGBT $T_1$ using any known modulation technique such was pulse-width modulation (PWM). That is, the logic signal ON may be, for example, a PWM signal. In many applications, the controller 10 will be configured to generates a plurality of logic signals to drive a plurality of power electronic devices.

The power electronic device (e.g. the semiconductor switch $T_1$) of the system of FIG. 3 has a rated (nominal) maximum temperature $T_{J,max}$ and the power electronic system has a rated (nominal) maximum power $P_{max,rated}$ (see also FIG. 2). The cooling (sub-) system is thermally coupled to the semiconductor switch (and other heat dissipating elements of the power electronics system) and configured to carry heat away from the power electronic system using a cooling agent (coolant). The controller 10 is configured to receive information concerning the sensed junction temperature $T_J$ of the semiconductor switch $T_1$ and the temperature $T_{COOL}$ of the cooling agent. In the embodiments described herein, the controller can adjust a power $P_O$ of the power electronic system by controlling the switching operation (e.g. the switching state and the sequence of switching states) of the semiconductor switch (e.g. using the gate-driver, see FIG. 3).

Based on the sensed junction temperature $T_J$ of the semiconductor switch $T_1$ and the temperature $T_{COOL}$ of the cooling agent recirculating in the cooling system the controller 10 can adjust the power $P_O$ of the power electronic system to a target value $P_{max,rated}+\Delta P_{boost}$ greater than the rated maximum power $P_{max,rated}$ if the temperature $T_{COOL}$ of the cooling agent is below a threshold temperature (e.g. critical temperature $T_H$, see FIG. 2). As mentioned, this mode of operation is referred to as boost mode. At the mentioned threshold temperature (which may be the critical temperature $T_H$) the maximum power $P_O$ of the power electronic system corresponds to the rated maximum power $P_{max,rated}$.

In the example shown in FIG. 2, the system operates in boost mode for low coolant temperatures (up to $T_H$) and in power derating mode for higher temperatures (above $T_H$). Another example of the novel control scheme for power electronic systems is visualized by the diagrams of FIGS. 4 and 5. According to the depicted example, the system can operate in three different modes, namely in boost mode (for coolant temperatures $T_{COOL}$ below a threshold temperature $T_R$, i.e. $T_{COOL} \leq T_R$), in rated power mode (for coolant temperatures $T_{COOL}$ between the threshold temperature $T_R$ and the critical temperature $T_H$, i.e. $T_R < T_{COOL} \leq T_H$) and in power derating mode (for coolant temperatures $T_{COOL}$ above the critical temperature $T_H$, i.e. $T_H < T_{COOL}$). The y-axis associated with the system power $P_O$ is at the left side of the diagram of FIG. 4.

In the boost mode the power electronic devices included in the system are operated at a power $P_O=P_{max,rated}+\Delta P_{boost}$ above the rated maximum power $P_{max,rated}$ for low coolant temperatures ($T_{COOL} \leq T_R$). The power $P_O$ can be increased beyond the maximum rated power $P_{max,rated}$ to such an extent that the actual junction temperature $T_J$ is closer to the maximum junction temperature $T_{J,max}$ than it would be if the power $P_O$ would be limited to $P_{max,rated}$. As mentioned above with reference to FIG. 2, the junction temperature may rise up to the threshold temperature $T_{J,set}(T_{COOL})$ in boost mode, which may be a function of the coolant temperature $T_{COOL}$. For medium coolant temperatures ($T_R < T_{COOL} \leq T_H$) the system is operated in the rated power mode and the system power $P_O$ is limited to the maximum rated power $P_{max,rated}$.

As in the previous example, the rated maximum power is reduced in power derating mode for coolant temperatures above the critical temperature $T_H$. When the coolant temperature $T_{COOL}$ reaches the switch-off threshold temperature $T_{OFF}$ the system is shut down to avoid thermal damage. Also, when at any time the measured junction temperature exceeds the rated maximum junction temperature $T_{J,max}$ (e.g. 150° C. in the example of FIG. 4), the system is also shut down to avoid thermal damage to the electronic switch (es).

Figure 4:
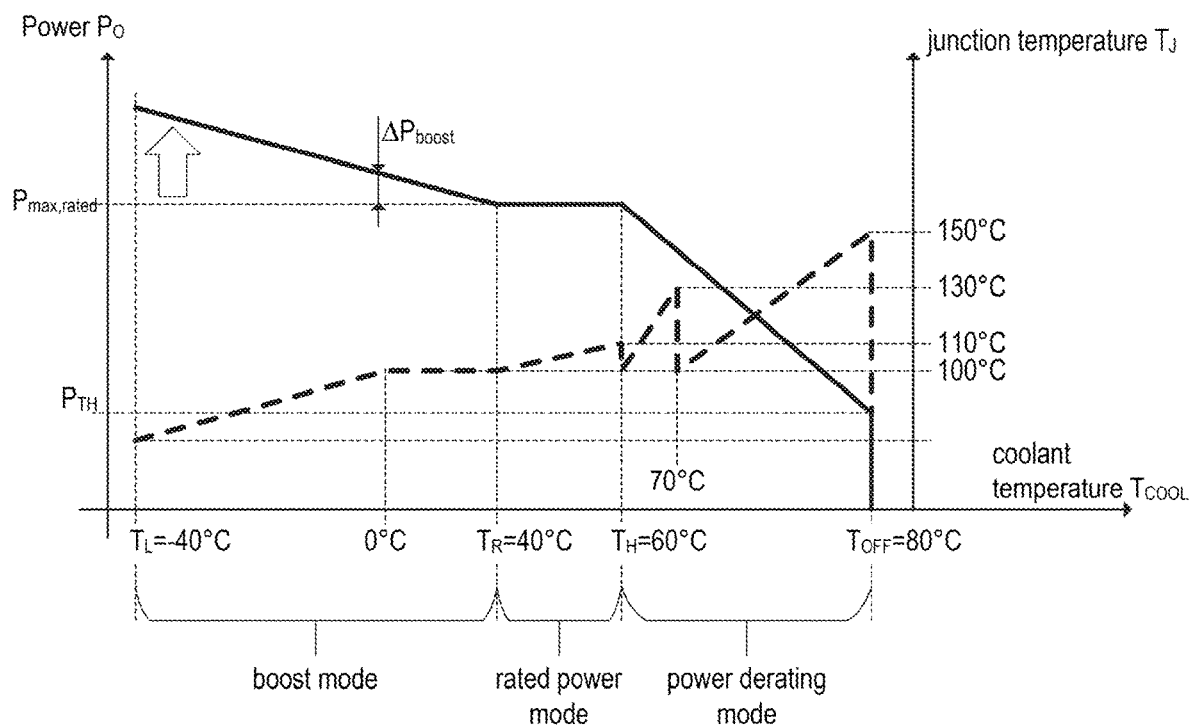
FIGS. 4 and 5 illustrate another example of the novel control scheme for power electronic systems.

An exemplary curve illustrating the junction temperature $T_J$ is also included in the diagram of FIG. 4, wherein the y-axis associated with the junction temperature $T_J$ is on the right side of the diagram). The solid line illustrates the system power $P_O$ and the bold dashed line illustrates the junction temperature $T_J$. In the depicted example, the junction temperature $T_J$ rises up to 100° C. in boost mode as the coolant temperature $T_{COOL}$ rises from temperature $T_L$ of −40° C. to approximately 0° C. When the coolant temperature $T_{COOL}$ rises further up to the threshold temperature $T_R$ (+40° C.), the junction temperature $T_J$ will remain at approximately 100° C. and not rise further as the system power $P_O$ is decreased as the coolant temperature increases.

In the rated power mode, the system power $P_O$ is limited to the (constant) rated maximum power $P_{max,rated}$. Therefore, the junction temperature $T_J$ can rise to temperatures beyond 100° C. In the depicted example, the junction temperature $T_J$ rises from 100° C. to 110° C. as the coolant temperature $T_{COOL}$ increases from 40° C. to 60° C. (i.e. the critical temperature $T_H$ in the present example).

If the coolant temperature rises to temperatures above the critical temperature $T_H$, the system operates in power derating mode and the controller successively reduces the system power $P_O$ dependent on the measured junction temperature $T_J$ and the measured coolant temperature $T_{COOL}$. In the undesired case that the coolant temperature reaches the switch-off threshold temperature $T_{OFF}$ or if the junction temperature $T_J$ reaches its absolute maximum rating $T_{J,max}$, then the system is shut down ($P_O$=0 W) to avoid thermal damage. The power derating may be done stepwise and, as a result, corresponding rapid temperature changes may occur as shown at $T_{COOL}$=70° C. in the depicted example. It is understood, that FIG. 4 is merely an illustrative example and the actual curves may be different dependent on the actual application. At this point it is emphasized that FIG. 4 illustrates merely the result of a thermal control scheme in accordance with the concept described herein. Different possible control schemes to achieve such a result (or a similar result) are illustrated in FIG. 5.

Figure 5:
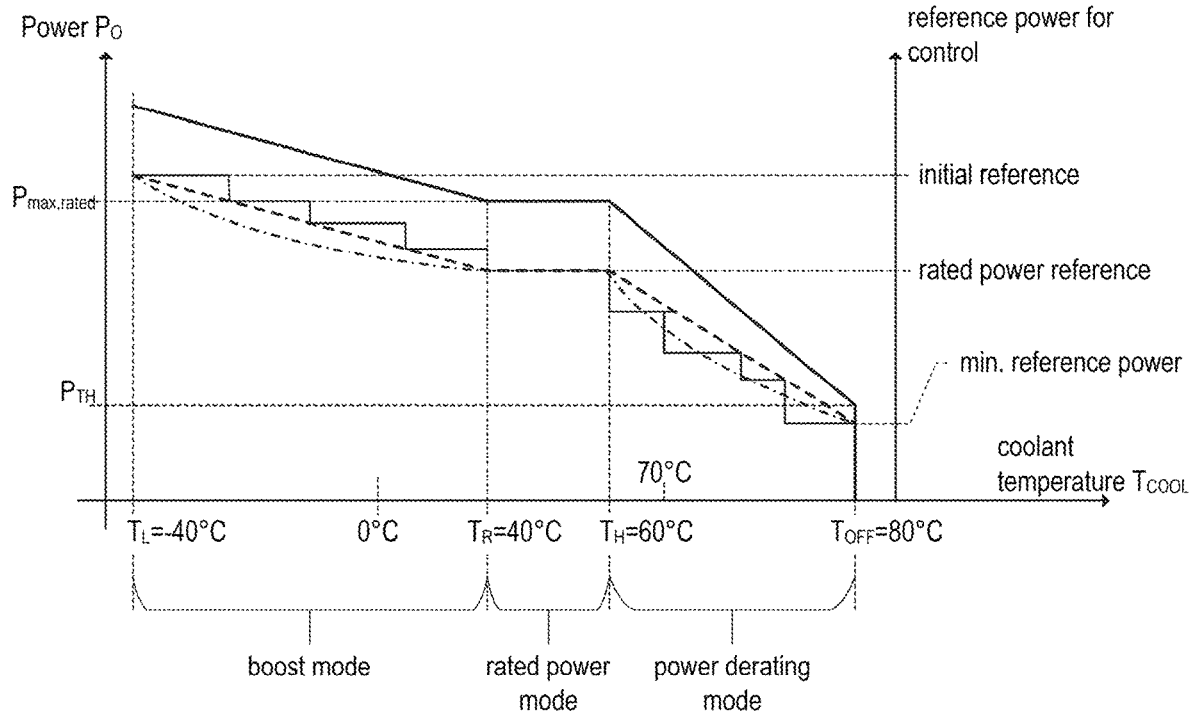

In FIG. 5, the bold solid line represents the system power (like in FIG. 4), whereas the thin solid line, the dashed line and the dash-dotted line represent different progresses of a reference power used in the control algorithm performed by the controller 10. The reference power may be regarded as set-point value that is an input variable to the control algorithm.

As can be seen in FIG. 5, the actual system power $P_O$ is equal to the rated maximum power $P_{max,rated}$ in the rated power mode (at least in the quasi-stationary case), which is a result of the reference power being equal to the rated reference power. In the boost mode (i.e. when $T_{COOL} \le T_R$) the reference power is decreased (starting at an initial reference power when $T_{COOL}=T_L$) as the coolant temperature $T_{COOL}$ rises. The decrease of the reference power may be accomplished stepwise (see FIG. 5, thin solid line), in accordance with a straight, linear line, (see FIG. 5, dashed line), or in accordance with any other degressive function (see FIG. 5, dash-dotted line). In the power derating mode, the reduction of the reference power can be accomplished analogously (stepwise, linear, etc.). The actual system power $P_O$ will follow the reference power in accordance with the control law used in the control algorithm that is executed by the controller 10. In a simple implementation the control law may correspond to a PID (proportional-integral-derivative) controller or the like. In the depicted example, the step-like reduction of the reference power at $T_{COOL}$=70° C. may lead to the rapid drop of the junction temperature shown in FIG. 4.

Figure 6:
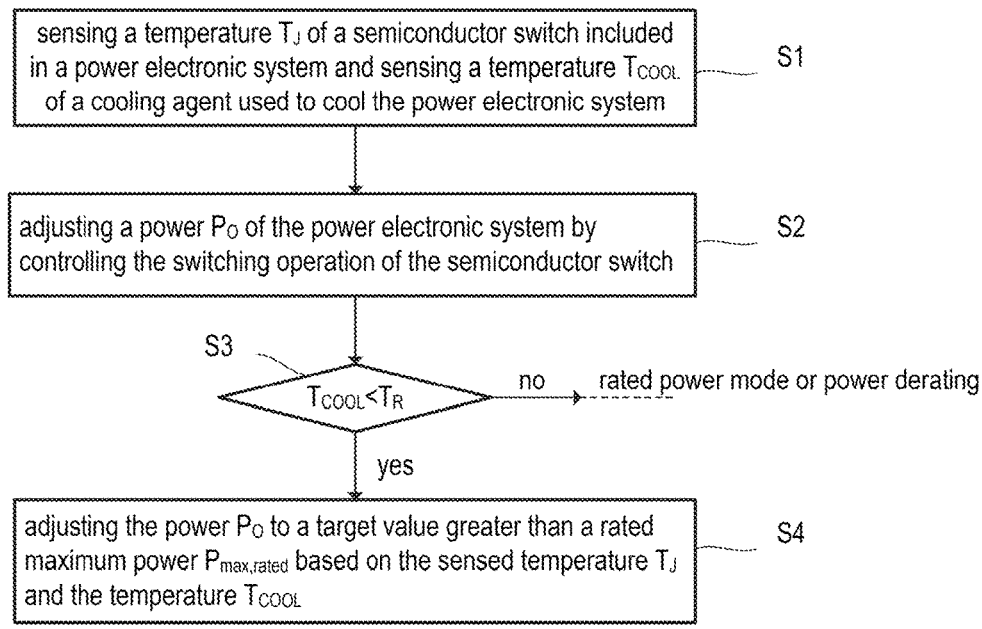
FIG. 6 is a flow chart illustrating a method in accordance with one embodiment described herein.

The concept described above is further illustrated by the flow chart depicted in FIG. 6. In essence, FIG. 6 illustrates a method for controlling a power electronic system which may include one or more power electronic devices such as semiconductor switches. According to the example of FIG. 6, the method includes sensing a temperature $T_J$ of the semiconductor switch (e.g. a junction temperature) included in the power electronic system (see FIG. 6, reference symbol S1). Furthermore, the temperature $T_{COOL}$ of a cooling agent is sensed. The cooling agent (coolant) may recirculate in a cooling system that is thermally coupled to the power electronic system and in particular to the semiconductor switch so that the coolant cools the power electronic system by carrying away the heat dissipated by the semiconductor switch(es).

The method further includes adjusting a power (see, e.g., FIGS. 4 and 5, power $P_O$) of the power electronic system by controlling the switching operation of the semiconductor switch (see FIG. 6, reference symbol S2). When the temperature $T_{COOL}$ of the coolant is below a threshold temperature (see FIG. 6, reference symbol S3), the power $P_O$ of the power electronic system is adjusted to a target value greater than a rated maximum power $P_{max,rated}$ (see FIG. 6, reference symbol S4) based on the sensed temperature $T_J$ of the semiconductor switch and further based on the temperature $T_{COOL}$ of the coolant.

The mentioned threshold temperature may be the critical temperature $T_H$ (see bottom diagram of FIG. 2) or, alternatively, a threshold temperature $T_R$ (lower that $T_H$, see FIG. 4). In order to adjust the power $P_O$ of the power electronic system the power $P_O$ may be increased as long as the sensed temperature $T_J$ of the semiconductor switch is below a temperature threshold $T_{J,set}(T_{COOL})$ which depends on the temperature $T_{COOL}$ of the cooling agent. As described above, the control of the system power $P_O$ may be accomplished using a system controller (see FIG. 3, controller 10).

In one embodiment, the system controller includes a memory for storing a characteristic curve representing the temperature threshold $T_{J,set}(T_{COOL})$ over the temperature $T_{COOL}$ the cooling agent. Accordingly, the characteristic curve may be represented by digital values stored in the memory and forming a lookup-table.

In one example, the look-up table, may include a sequence of temperature values $T_{J,set}(T_{COOL})$, which may be regarded as threshold temperatures that are used in boost mode to control the power $P_O$ of the power electronic system. Thereby, the temperature values $T_{J,set}(T_{COOL})$ depend on the coolant temperature $T_{COOL}$. In boost mode (e.g. when $T_{COOL} \le T_R$) the system controller 10 may continuously monitor the temperatures $T_J$ and $T_{COOL}$, and—when the currently measured junction temperature $T_J$ is below the stored threshold value $T_{J,set}(T_{COOL})$—the system power $P_O$ is set to a predefined value $P_O(T_{COOL})$, which depends on the currently measured coolant temperature $T_{COOL}$. Various values for $P_O(T_{COOL})$ may be also stored in the look-up table. The values $P_O(T_{COOL})$ may be used as reference power, which has been discussed above, e.g., with reference to FIG. 5. When the currently measured junction temperature $T_J$ exceeds the stored threshold value $T_{J,set}(T_{COOL})$, the system power $P_O$ is adjusted to be equal to the rated maximum power $P_{max,rated}$, which may also be included in the lookup table.

When the temperature $T_{COOL}$ of the cooling agent is above the critical temperature $T_H$ the system operates in power derating mode controller reduces the power $P_O$ of the power electronic system to a target value lower than the rated maximum power $P_{max,rated}$ based on the sensed temperature $T_J$ of the semiconductor switch. The power derating may be accomplished stepwise, linearly or in accordance with any other degressive function.

In one example, the power electronic system includes a plurality of semiconductor switches, wherein the temperature sensor is configured to sense a temperature representing the temperature $T_J$ of at least one of the plurality semiconductor switches. The temperature sensor circuit may include a plurality of sensing elements. These can be integrated in the semiconductor switch, coupled to a chip package or otherwise thermally coupled to the semiconductor switch. The measured coolant temperature $T_{COOL}$ may be communicated to the system controller by another external device, e.g. by a controller of the cooling subsystem which can communicate with the system controller 10 via a digital communication link.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A system comprising:
   a power electronic system including a semiconductor switch, the power electronic system comprising a rated maximum power and a maximum rated temperature;
   a temperature sensor configured to sense a temperature of the semiconductor switch;
   a cooling system thermally coupled to the power electronic system and configured to carry heat away from the power electronic system using a cooling agent; and
   a controller configured to:
      receive information indicating a sensed temperature of the semiconductor switch and a temperature of the cooling agent;
      based on a determination that the temperature of the cooling agent is less than a first temperature threshold:
         determine, based on the temperature of the cooling agent, a second threshold temperature that is less than the maximum rated temperature;
         based on a determination that the sensed temperature of the semiconductor switch is less than the second threshold temperature, determine, based on the temperature of the cooling agent, a target value for the power electronic system that is greater than the rated maximum power;
         based on a determination that the sensed temperature of the semiconductor switch is greater than the second threshold temperature, set the target value for the power electronic system to the rated maximum power; and
      adjust a power of the power electronic system by controlling a switching operation of the semiconductor switch to the target value.

2. The system of claim 1, wherein the controller includes a memory for storing a characteristic curve representing the second temperature threshold over the temperature the cooling agent.

3. The system of claim 2, wherein the characteristic curve is represented by digital values stored in the memory and forming a lookup-table.

4. The system of claim 1, wherein the target value is a first target value, wherein the controller is further configured to:
   based on a determination that the temperature of the cooling agent is greater than the first temperature threshold, reduce the power of the power electronic system from the rated maximum power to a second target value based on the sensed temperature of the semiconductor switch.

5. The system of claim 1,
   wherein the power electronic system includes a plurality of semiconductor switches, and
   wherein the temperature sensor is configured to sense the temperature representing at least one of the plurality of semiconductor switches.

6. The system of claim 1, further comprising:
   a sensor configured to sense a coolant temperature, or
   a communication link via which the controller can receive information concerning the coolant temperature from an external device.

7. The system of claim 1, wherein the power electronic system comprises one or more of a multi-phase inverter, a switched mode power supply (SMPS), an AC/DC converter, or a DC/DC converter.

8. The system of claim 1, wherein the cooling agent comprises water.

9. A method for controlling a power electronic system, the method comprising:
   sensing a temperature of a semiconductor switch included in the power electronic system, the power electronic system comprising a rated maximum power and a maximum rated temperature;
   determining that a temperature of a cooling agent for carrying heat away from the power electronic system is less than a first temperature threshold;
   based on the determination that the temperature of the cooling agent is less than the first temperature threshold:
      determining, based on the temperature of the cooling agent, a second threshold temperature that is less than the maximum rated temperature;
      determining that the sensed temperature of the semiconductor switch is less than the second threshold temperature;
      based on the determination that the sensed temperature of the semiconductor switch is less than the second threshold temperature, determining a target value for the power electronic system based on the temperature of the cooling agent, wherein the target value is greater than the rated maximum power; and
   adjusting a power of the power electronic system by controlling a switching operation of the semiconductor switch to the target value.

10. The method of claim 9, further comprising:
    after adjusting the power of the power electronic system, determining that the temperature of the cooling agent is greater than a critical temperature; and
    based on the determination that the temperature of the cooling agent is greater than the critical temperature, derating the power of the power electronic system to a value lower than the rated maximum power based on the sensed temperature of the semiconductor switch.

11. The method of claim 9, further comprising:
    after adjusting the power of the power electronic system, determining that the temperature of the cooling agent is greater than the first temperature threshold; and
    based on the determination that the temperature of the cooling agent is greater than the first temperature threshold, derating the power of the power electronic system to a value lower than the rated maximum power based on the sensed temperature of the semiconductor switch.

12. The method of claim 9, further comprising:
    after adjusting the power of the power electronic system, determining that the temperature of the cooling agent is greater than the first temperature threshold and less than a critical temperature; and operating the power electronic system at the rated maximum power based on the determination that the temperature of the cooling agent is greater than the first threshold temperature and less than the critical temperature.

13. The method of claim 9, wherein the power electronic system comprises one or more of a multi-phase inverter, a switched mode power supply (SMPS), an AC/DC converter, or a DC/DC converter.

* * * * *